United States Patent [19]

Taniguchi

[11] Patent Number: 4,972,080
[45] Date of Patent: Nov. 20, 1990

[54] SIGNAL PROCESSING APPARATUS FOR PULSE ENCODER WITH A/D CONVERSION AND CLOCKING

[75] Inventor: Mitsuyuki Taniguchi, Yamanashi, Japan

[73] Assignee: Fanuc Ltd., Yamanashi, Japan

[21] Appl. No.: 368,392

[22] PCT Filed: Aug. 19, 1988

[86] PCT No.: PCT/JP88/00824
§ 371 Date: Mar. 30, 1989
§ 102(e) Date: Mar. 30, 1989

[87] PCT Pub. No.: WO89/01607
PCT Pub. Date: Feb. 23, 1989

[30] Foreign Application Priority Data

Aug. 20, 1987 [JP] Japan .................. 62-205141

[51] Int. Cl.$^5$ .............................. G01D 5/34
[52] U.S. Cl. ....................... 250/231.16; 250/237 G
[58] Field of Search ........ 250/231 SE, 237 G, 231.13, 250/231.16; 356/375; 341/15

[56] References Cited

U.S. PATENT DOCUMENTS

| 4,346,447 | 8/1982 | Takahama | 250/231 SE |
| 4,360,730 | 11/1982 | Breslow | 250/231 SE |
| 4,587,485 | 5/1986 | Papiernik | 250/231 SE |
| 4,782,329 | 11/1988 | Iijima | 341/15 |

Primary Examiner—David C. Nelms
Assistant Examiner—Sherrie Hsia
Attorney, Agent, or Firm—Armstrong, Nikaido, Marmelstein, Kubovcik & Murray

[57] ABSTRACT

A signal processing apparatus for a pulse encoder for electrically processing an output signal from a signal generating source and improving the resolution of the encoder. A sine-wave signal and a cosine-wave signal supplied from the signal generating source are converted into digital signals by a first and a second A/D converters, and supplied to a signal converting device. The signal converting device outputs an analog amplitude level and position data in response to the outputs from the first and second A/D converters. Consequently, the signal processing apparatus for the pulse encoder has a simple circuit arrangement and a small size, furthermore, the apparatus can confirm the intensity of a signal supplied from the signal generating source.

10 Claims, 8 Drawing Sheets

SIGNAL PROCESSING APPARATUS FOR PULSE ENCODER WITH A/D CONVERSION AND CLOCKING

TECHNICAL FIELD

The present invention relates to a signal processing apparatus for a pulse encoder, more particularly, to a signal processing apparatus for a pulse encoder for electrically processing an output signal from a signal generating source and improving the resolution of the encoder.

A pulse encoder is mainly used for an NC machine tool, an industrial robot, and the like. A rotary pulse encoder mounted on a shaft of a motor or the like and a linear pulse encoder mounted on a machining table or the like, are generally known. A signal processing apparatus for a pulse encoder according to the present invention can be used for both the rotary and linear pulse encoders.

BACKGROUND ART

A signal processing technique for electrically processing a sine-wave signal and a cosine-wave signal supplied from a signal generating source for a pulse encoder, and improving the resolution of the encoder is conventionally known.

A conventional signal processing apparatus for a pulse encoder comprises, for example, a rotary code plate mounted on a shaft of a motor or the like, in which a plurality of slits are formed, a fixed code plate in which a plurality of slits are formed, a signal generating source having a light-emitting diode and a photodiode, and a signal processing apparatus. The signal processing apparatus comprises a plurality of resistor and comparator array, and the resolution of the encoder is increased by the resistors and the comparator array. For example, when the resolution of the encoder is increased 10 times, 20 circuits each comprising resistors and a comparator are required, and 20 types of signals each having different phases are generated.

When the resolution of the encoder is increased 10 times, for example, 60 resistors and 20 comparator are required in order to improve the resolution of the encoder. Therefore, the cost required for the resistors and the comparator array is increased and the signal processing apparatus becomes bulky. In addition, the conventional signal processing apparatus for the pulse encoder cannot confirm the intensity of a signal supplied from the signal generating source. Therefore, when a signal having an insufficient intensity is processed, an erroneous pulse signal is often output.

DISCLOSURE OF THE INVENTION

In consideration of the above problems of the conventional signal processing apparatus for the pulse encoder, it is an object of the present invention to provide a signal processing apparatus for a pulse encoder to achieve a simple circuit arrangement and reduction of the circuit size, and confirm the intensity of a signal supplied from a signal generating source.

According to the present invention, there is provided a signal processing apparatus for a pulse encoder, comprising a first A/D converter for converting a sine-wave signal supplied from a signal generating source into a digital signal, a second A/D converter for converting a cosine-wave signal supplied from the signal generating source into a digital signal, and a signal converting means for receiving outputs of the first and second A/D converters and outputting an analog amplitude level and position data in response to the outputs from the first and second A/D converters, respectively.

In a signal processing apparatus for a pulse encoder having the above arrangement according to the present invention, the sine-wave signal supplied from the signal generating source is converted into a digital signal by the first A/D converter, and the cosine-wave signal supplied from the signal generating source is converted into a digital signal by the second A/D converter. The signal converting means receives outputs from the first and second A/D converters and outputs an analog amplitude level and position data from the outputs from the first and second A/D converters, respectively.

Therefore, the circuit arrangement can be simplified and the circuit size can be reduced. Since an analog amplitude level can be confirmed in addition to position data, for example, an erroneous pulse signal obtained when a signal generating source is processed is not output.

BEST MODE FOR CARRYING OUT THE INVENTION

First, the problems of a conventional signal processing apparatus for a pulse encoder will be explained with reference to FIGS. 1 and 2, before the explanation of a signal processing apparatus for a pulse encoder according to the present invention is explained.

Figure 1:
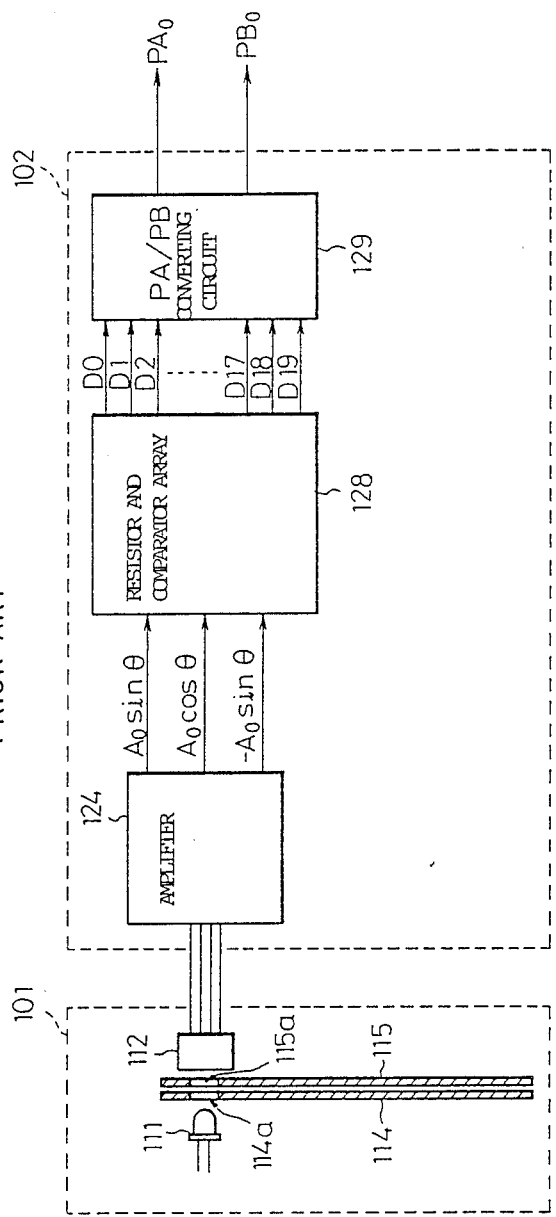
FIG. 1 is a block diagram showing a typical conventional signal processing apparatus for a pulse encoder.

FIG. 1 is a block diagram showing a typical conventional signal processing apparatus for a pulse encoder. As shown in FIG. 1, the pulse encoder is constructed by a signal generating source 101 and a signal processing apparatus 102. The signal generating source 101 is constructed by a rotary code plate 114 mounted on a shaft of a motor or the like, in which a plurality of slits 114a are formed, and a fixed code plate 115 in which a plurality of slits 115a are formed, a light-emitting diode 111, and a photodiode 112. The photodiode 112 receives light output from the light-emitting diode 111 through the slits 114a of the rotary code plate 114 and the slits 115a of the fixed code plate 115.

An output from the photodiode 112 is supplied to an amplifier 124 of the signal processing apparatus 102. Signals $A_0 \sin \theta$, $A_0 \cos \theta$, and $-A_0 \sin \theta$ are supplied from the amplifier 124 to a resistor and comparator array 128. When the resolution of the encoder is increased, e.g., 10 times or more by the resister and comparator array 128, 20 types of signals $D_0$ to $D_{19}$ having different phases are synthesized, and the composite signal is supplied to a PA/PB converter 129. The PA/PB converter 129 output pulse signals $PA_0$ and $PB_0$ which are electrically processed to increase the resolution 10 times.

Figure 2:
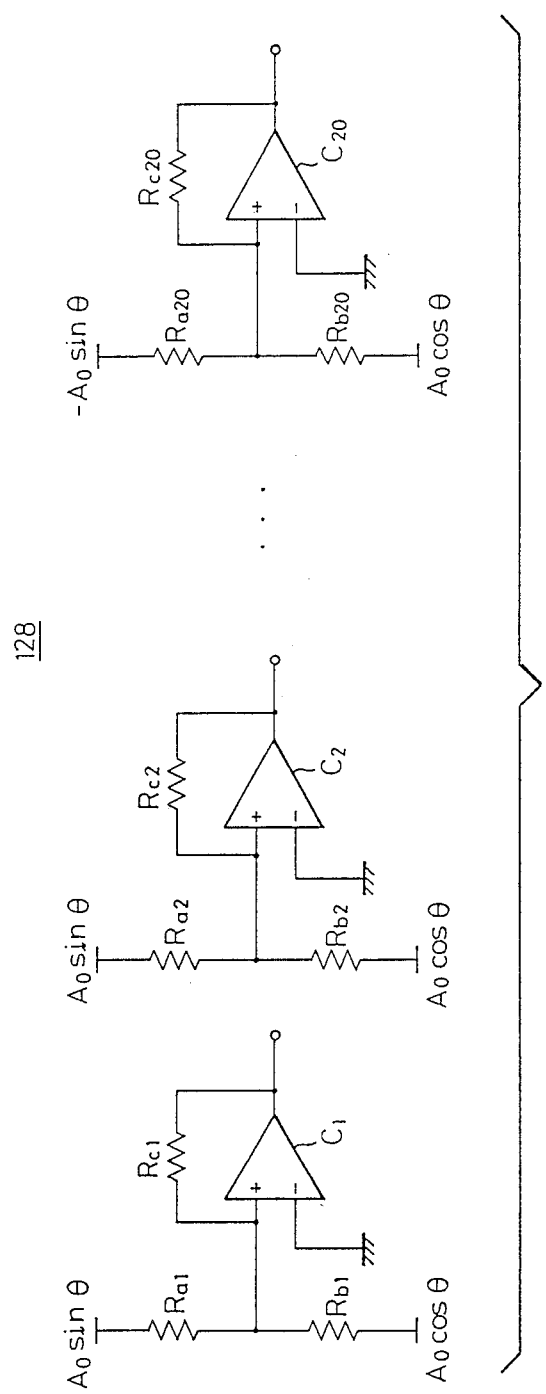
FIG. 2 is a circuit diagram showing a part of a resistor and comparator array shown in FIG. 1.

FIG. 2 is a circuit diagram showing a part of the resistor and comparator array in FIG. 1. As shown in FIG. 2, in the resistor and comparator array 128, a plurality of circuits each having three resistors and one comparator, are arranged. For example, an output signal having a predetermined phase corresponding to a ratio of the resistance value of a resistor $Ra_1$ to that of a resistor $Rb_1$ is obtained from the signals $A_0 \sin \theta$ and $A_0 \cos \theta$ which are supplied from the amplifier 124. Therefore, for example, when the resolution of the encoder is increased 10 times, 20 circuits having combinations of 20 such resistors and comparators are required. 20 types of signals $D_0$ to $D_{19}$ having different phases are synthesized by the plurality of resistors and comparators.

As described above, the conventional signal processing apparatus for the pulse encoder for electrically parocessing a signal supplied from the signal generating source 101 and improving the resolution of the encoder requires a plurality of resistors and comparators (for example, when the resolution is increased 10 times, 60 resistors and 20 comparators are required) in order to improve the resolution of the encoder. Therefore, the cost required for the resistor and comparator array 128 is increased, and the signal processing apparatus 102 becomes bulky. In addition, the conventional signal processing apparatus for the pulse encoder cannot confirm the intensity of a signal supplied from the signal generating source 101. Therefore, when a signal having an insufficient intensity is processed, an erroneous pulse signal is often output.

An embodiment of a signal processing apparatus for a pulse encoder according to the present invention will be described hereinafter with reference to the accompanying drawings.

Figure 3:
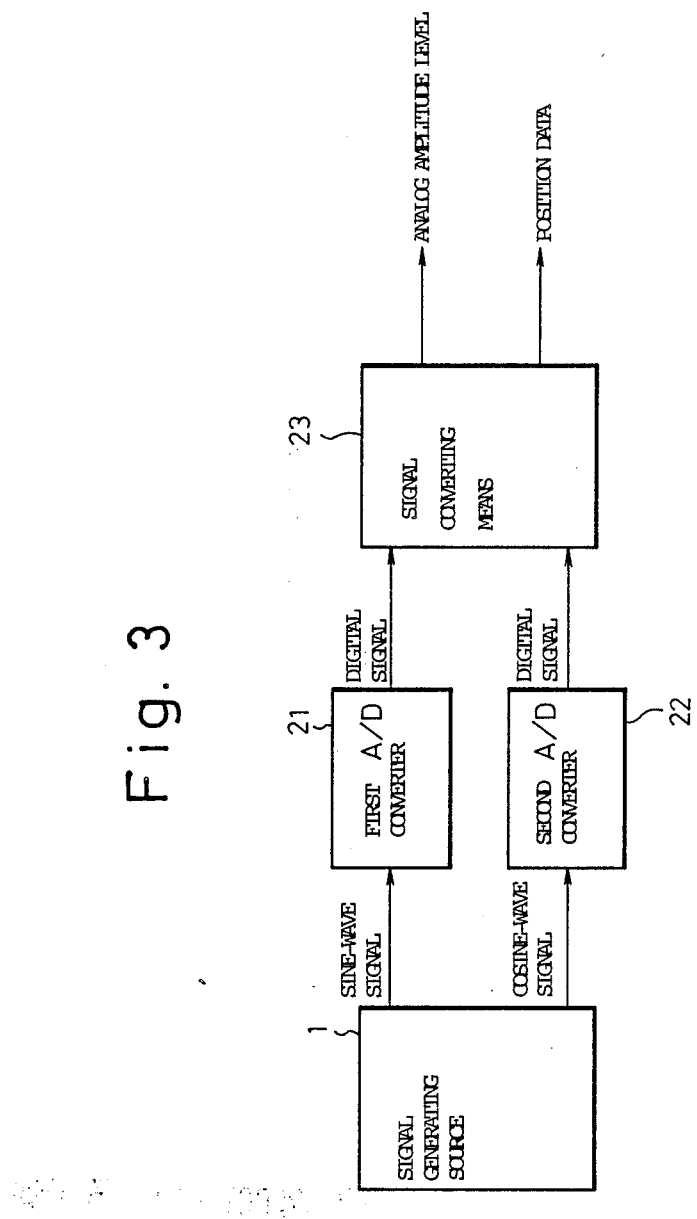
FIG. 3 is a block diagram showing a principle of a signal processing apparatus for a pulse encoder according to the present invention.

FIG. 3 is a block diagram showing a principle of a signal processing apparatus for a pulse encoder according to the present invention. As shown in FIG. 3, the signal processing apparatus for the pulse encoder comprises a first A/D converter 21 for converting a sine-wave signal supplied from a signal generating source 1 into a digital signal, a second A/D converter 22 for converting a cosine-wave signal supplied from the signal generating source 1 into a digital signal, and a signal converting means 23 for receiving output of the first and second A/D converters 21 and 22, and outputting an analog amplitude level and position data in response to the outputs from the first and second A/D converters 21 and 22, respectively. The sine-wave signal supplied from the signal generating source 1 is converted into a digital signal by the first A/D converter 21, and the cosine-wave signal supplied from the signal generating source 1 is converted into a digital signal by the second A/D converter 22. The signal converting means 23 receives outputs from the first and second A/D converters 21 and 22, and outputs an analog amplitude level and position data from the outputs from the first and second A/D converters 21 and 22, respectively.

Figure 4:
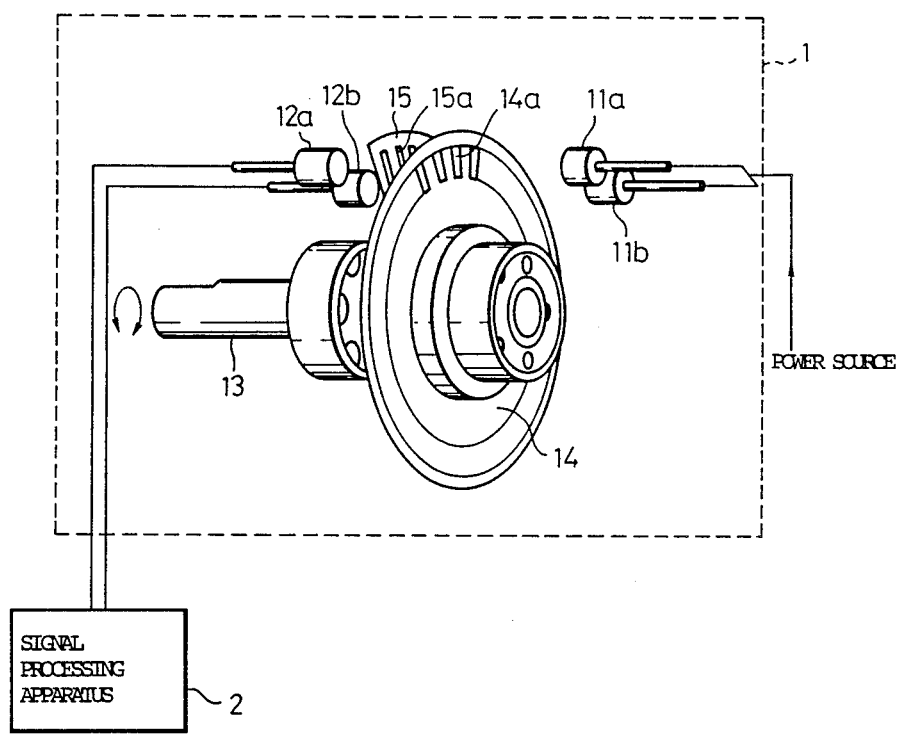
FIG. 4 is a schematic view showing a typical rotary pulse encoder to which the signal processing apparatus for the pulse encoder according to the present invention is applied.

FIG. 4 is a schematic view showing a typical rotary pulse encoder to which the signal processing apparatus for the pulse encoder according to the present invention is applied. A signal generating source 1 is constituted by an optical means utilizing light-emitting diodes 11a and 11b and photodiodes 12a and 12b.

As shown in FIG. 4, the signal processing apparatus for the pulse encoder is used, e.g., to measure a motor speed. A rotary code plate 14 in which a plurality of slits 14a are formed is mounted on a rotating shaft 13 of a motor. The rotary code plate 14 intermittently transmits or interrupts light from the light-emitting diodes 11a and 11b accordance with the positional relationship between the rotary code plate 14 and a fixed code plate 15 in which a plurality of slits 15a are formed. The light beams emitted from the light-emitting diodes 11a and 11b and transmitted through the slits 14a of the rotary code plate 14 and the slits 15a of the fixed code plate 15 are sensed by photodiodes 12a and 12b, respectively. Then, the sensed light signals are supplied to a signal processing apparatus 2 and predetermined electrical processing is performed. The light-emitting diode 11a and the photodiode 12a, and the light-emitting diode 11b and the photodiode 12b are paired, respectively. The pairs of diodes are arranged so that light beams output from the light-emitting diodes 11a and 11b through the plurality of slits 14a and 15a of the rotary and fixed code plates 14 and 15 are input while their phase is shifted by 90°.

Figure 5:
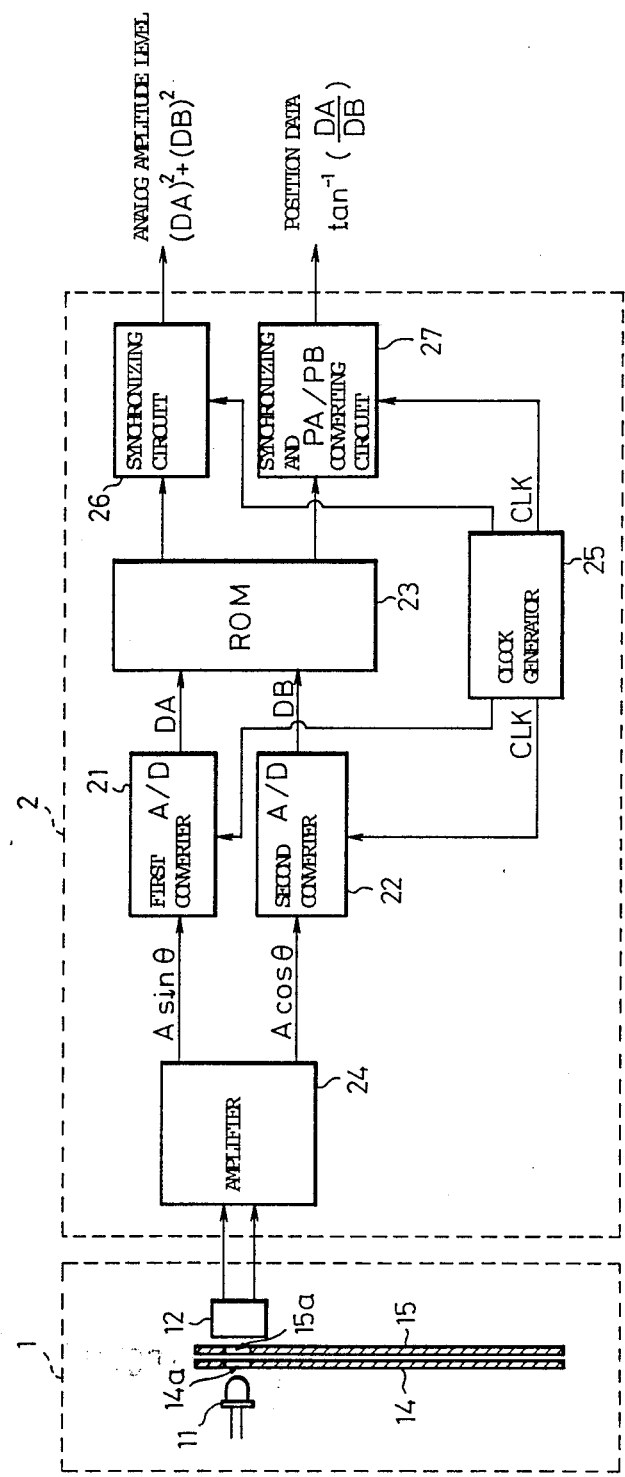
FIG. 5 is a block diagram showing an embodiment of the signal processing apparatus for the pulse encoder according to the present invention.

FIG. 5 is a block diagram showing an embodiment of the signal processing apparatus for the pulse encoder according to the present invention. As shown in FIG. 5, the pulse encoder is constituted by a signal generating source 1 and a signal processing apparatus 2. A signal supplied from the signal generating source 1 is amplified by an amplifier 24 in the signal processing apparatus 2. A sine-wave signal ($A \sin \theta$) output from the amplifier 24 is supplied to a first A/D converter (analog/digital converter) 21, and a cosine-wave signal ($A \cos \theta$) output from the amplifier 24 is supplied to a second A/D converter 22. The A/D converters 21 and 22 respectively receive clock signals CLK from a clock generator 25, and an A/D conversion is performed in response to the clock signals CLK.

Digital output signals DA and DB from the first and second A/D converter 21 and 22 are supplied to a ROM (read-only memory) 23, and the ROM 23 output an analog amplitude level and position data corresponding to the output signals DA and DB output from the A/D converters 21 and 22. When the analog amplitude level $[(DA)^2+(DB)^2]$ falls outside the predetermined range, an alarm signal is output from a synchronizing circuit 26 which receives a clock signal CLK from the clock generator 25. For example, when the intensity of a signal supplied from the signal generating source 1 is insufficient and the signal having an insufficient intensity is processed, an error operation can be prevented by the alarm signal output from the synchronizing circuit 26. Further, the position data $[\tan^{-1}(DA/DB)]$ is output at a proper timing from a synchronizing and PA/PB converting circuit 27 which receives a clock signal CLK from the clock generator 25.

Figure 6:
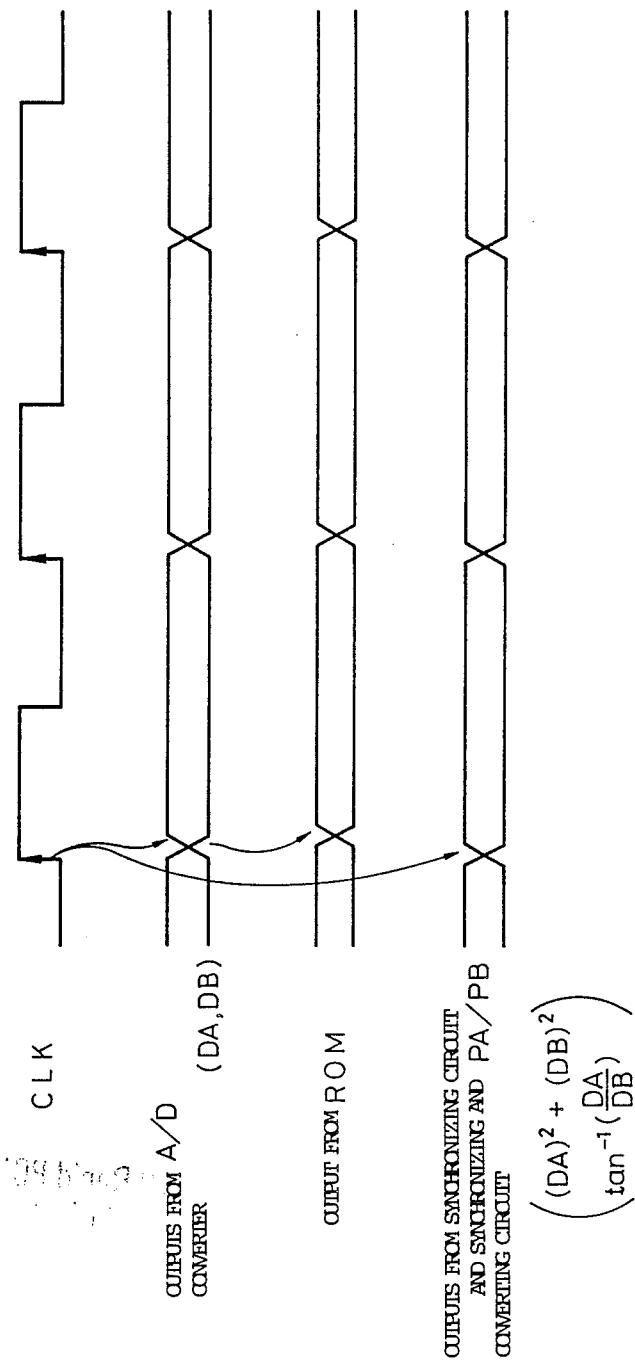
FIG. 6 is a timing chart of signals processed by the apparatus shown in FIG. 5.

FIG. 6 is a timing chart of signals processed by the apparatus shown in FIG. 5. As shown in FIG. 6, the output signals DA and DB are output from the first and second A/D converters 21 and 22, respectively, in response to leading edges of the clock signal CLK output from the clock generator 25. In addition, an analog amplitude level and position data corresponding to the output signals DA and DB are respectively output from the ROM 23 to the synchronizing circuit 26 and the synchronizing and PA/PB converting circuit 27 in response to the output signals DA and DB. The synchronizing circuit 26 and the synchronizing and PA/PB converting circuit 27 respectively receive clock signals from the clock generator 25, and stable signals are output from the synchronizing circuit 26 and the synchronizing and PA/PB converting circuit 27.

Figure 7:
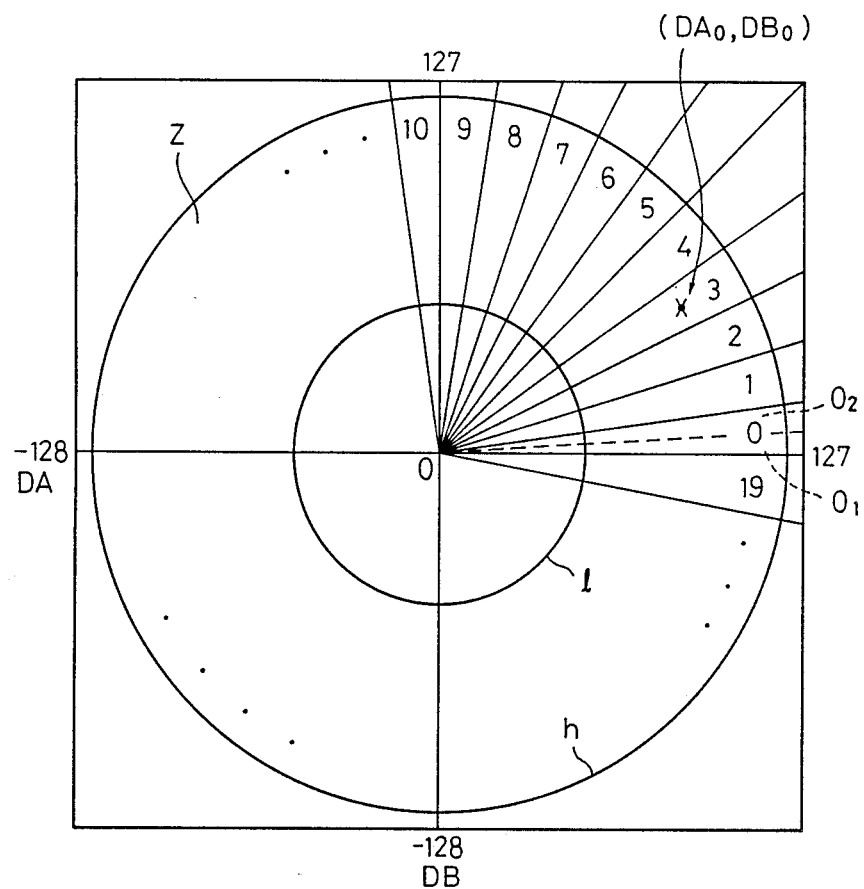
FIG. 7 is a view for explaining an operation table stored in a ROM shown in FIG. 5.

FIG. 7 is a view for explaining an operation table stored in a ROM shown in FIG. 5. The ROM 23 in FIG. 5 has, e.g., 16-bit addresses, and the output signals DA and DB from the first and second A/D converters 21 and 22 are 8-bit address signals. More specifically, addresses −128 to 127 (8 bits) are assigned to each of the output signals DA and DB. An analog amplitude level and position data corresponding to the operation table stored in the ROM are output in accordance with the combination of these output signals DA and DB. When the combination of the output signals DA and DB falls outside a doughnut-like zone Z defined by large and small circles h and l, i.e., at least one of the output signals DA and DB falls within the small circle l, or falls outside the large circle h, the intensity of a signal output from the photodiode 12 of the signal generating source 1 is determined to be improper, and an alarm signal which indicates that detection cannot be performed is output. In the signal processing apparatus of this embodiment, the ROM 23 is replaceable, i.e., the setting values of the radii of the large and small circles h and l can be changed, so that the range of the analog amplitude level for outputting an alarm can be changed.

Figure 8:
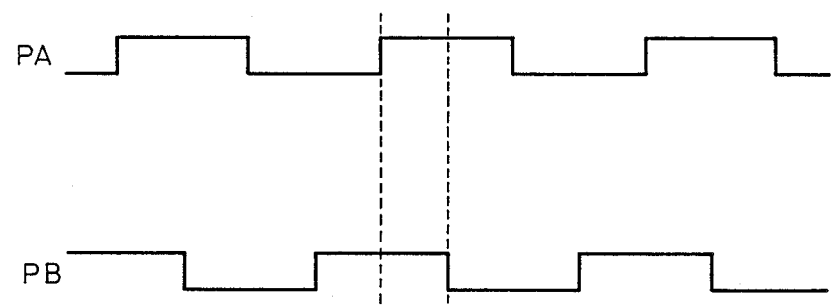
FIG. 8 is a waveform chart showing output signals processed by the apparatus shown in FIG. 5.

When the combination of the output signals DA and DB falls within the doughnut-like zone Z, the value in the position corresponding to the combination is supplied to the synchronizing and PA/PB converting circuit 27. More specifically, when the combination ($DA_0$, $DB_0$) of the output signal DA and DB falls within a region 3 in the zone Z, for example, the ROM 23 output a value 3. The value 3 is converted into the corresponding PA and PB values by synchronizing and PA/PB converting circuit 27. FIG. 8 is a waveform chart showing output signals of position data processed by the apparatus in FIG. 5. In the signal processing apparatus for the pulse encoder of this embodiment, the ROM 23 is replaceable, so that position data (the resolution of the encoder) can be variably set, in the same manner as in the case wherein the range of the analog amplitude level for outputting an alarm is set. Namely, in the doughnut-like zone Z divided into 20 regions, i.e., regions 0 to 19, for example, a region 0 is divided into two regions, i.e., $0_1$ and $0_2$, and other regions are similarly divided into halves so that 40 regions are obtained. Therefore, the resolution of the encoder can be increased 20 times.

In the above embodiment, in the analog amplitude level and the position data output from the ROM 23, the analog amplitude level is output in the form of $[(DA)^2+(DB)^2]$, and position data is output in the form of $[\tan^{-1}(DA/DB)]$. However, the output signals of the analog amplitude level and the position data in the signal processing apparatus for the pulse encoder according to the present invention are not limited to the above signal forms. Various arrangements can be realized in the signal generating source 1, and not only the rotary encoder in the above embodiment, but also a linear encoder mounted on a machining table or the like of a machine tool for performing high-precision machining may be used. In addition, the signal generating source 1 need not be constituted by the optical means of light-emitting and light-receiving elements, but may be constituted by magnetic means such as a magnet and a magnetic sensor.

I claim:

1. A signal processing apparatus for a pulse encoder, comprising:
a signal generating source for generating a sine-wave signal and a cosine-wave signal;
a clock generator for generating a clock signal;
a first A/D converter, connected to said signal generating source and said clock generator, for converting said sine-wave signal supplied from said signal generating source into a digital signal in response to the clock signal from said clock generator;
a second A/D converter, connected to said signal generating course and said clock generator, for converting said cosine-wave signal supplied from said signal generating source into a digital signal in response to the clock signal from said clock generator; and
a signal converting means, connected to said first and second A/D converters, for receiving outputs from said first and second A/D converters, and for outputting an analog amplitude level and position data in response to outputs from said first and second A/D converters, respectively.

2. An apparatus according to claim 1, wherein said signal generating source comprises optical means of light-emitting and light-receiving elements.

3. An apparatus according to claim 1, wherein said signal generating source comprises magnetic means of a magnet and a magnetic sensor.

4. An apparatus according to claim 1, wherein said pulse encoder is a rotary pulse encoder.

5. An apparatus according to claim 1, wherein said pulse encoder is a linear pulse encoder.

6. An apparatus according to claim 1, wherein said signal converting means includes a ROM.

7. An apparatus according to the claim 6, wherein said ROM is replaceable.

8. An apparatus according to claim 7, wherein a resolution of said position data output from said signal converting means is instituted by said ROM.

9. An apparatus according to claim 7, wherein a detectable range of said analog amplitude level output from said signal converting means is instituted by said ROM.

10. An apparatus according to claim 1, wherein when said analog amplitude level output from said signal converting means falls outside said detectable range of said analog amplitude level, an alarm signal which represents that detection cannot be performed is output.

* * * * *